United States Patent
Gold et al.

(10) Patent No.: US 10,368,467 B2
(45) Date of Patent: Jul. 30, 2019

(54) SYSTEM AND METHOD FOR DATA CENTER HEAT CONTAINMENT

(71) Applicant: Facebook, Inc., Menlo Park, CA (US)

(72) Inventors: Andrew Gold, Los Altos, CA (US); Scott C. Wiley, Los Altos, CA (US); Marco Antonio Magarelli, Sunnyvale, CA (US)

(73) Assignee: Facebook, Inc., Menlo Park, CA (US)

( * ) Notice: Subject to any disclaimer, the term of this patent is extended or adjusted under 35 U.S.C. 154(b) by 18 days.

(21) Appl. No.: 15/729,188

(22) Filed: Oct. 10, 2017

(65) Prior Publication Data

US 2019/0110378 A1    Apr. 11, 2019

(51) Int. Cl.
*H05K 7/20* (2006.01)
*B25J 5/02* (2006.01)
*B65G 1/04* (2006.01)

(52) U.S. Cl.
CPC ........... *H05K 7/20781* (2013.01); *B25J 5/02* (2013.01); *B65G 1/0435* (2013.01); *H05K 7/20754* (2013.01)

(58) Field of Classification Search
CPC .................................................. H05K 7/20781
See application file for complete search history.

(56) References Cited

U.S. PATENT DOCUMENTS

| | | | |
|---|---|---|---|
| 4,659,902 A * | 4/1987 | Swensrud | B23K 26/0823 219/121.74 |
| 6,327,143 B1 * | 12/2001 | Bonstrom | G06F 1/16 361/679.4 |
| 7,013,198 B2 * | 3/2006 | Haas | B65G 1/045 414/222.12 |
| 7,430,118 B1 * | 9/2008 | Noteboom | H05K 7/20745 361/695 |
| 7,778,031 B1 * | 8/2010 | Merrow | G11B 17/225 165/121 |
| 8,523,643 B1 * | 9/2013 | Roy | G06F 1/20 454/184 |
| 8,759,084 B2 * | 6/2014 | Nichols | A61L 2/06 422/1 |
| 8,857,208 B2 * | 10/2014 | Malin | F25D 25/04 236/1 B |
| 8,867,204 B1 * | 10/2014 | Gardner | H05K 7/1497 361/679.46 |
| 9,497,892 B2 * | 11/2016 | Klaba | H05K 7/20745 |
| 2002/0023444 A1 * | 2/2002 | Felder | F25D 25/00 62/177 |
| 2004/0213651 A1 * | 10/2004 | Malin | B65G 1/045 414/331.05 |

(Continued)

*Primary Examiner* — David M Sinclair
*Assistant Examiner* — Robert D Brown
(74) *Attorney, Agent, or Firm* — FisherBroyles, LLP

(57) ABSTRACT

The disclosed system may include a group of information technology racks, where (1) each of the information technology racks stores information technology device modules, (2) the group of information technology racks are arranged such that interior faces of the information technology racks define a vertical column of space enclosed by the group of information technology racks, and (3) the information technology racks ventilate air heated by the information technology device modules from the interior faces of the information technology racks into the vertical column of space such that the heated air is contained within the vertical column of space.

20 Claims, 16 Drawing Sheets

(56) References Cited

U.S. PATENT DOCUMENTS

| | | | |
|---|---|---|---|
| 2006/0259195 A1* | 11/2006 | Eliuk | A61J 1/20 700/245 |
| 2006/0263270 A1* | 11/2006 | Rizzotte | G01N 35/0099 422/400 |
| 2007/0064383 A1* | 3/2007 | Tanaka | G06F 1/181 361/679.33 |
| 2009/0017733 A1* | 1/2009 | Takahashi | B24B 9/065 451/57 |
| 2009/0251860 A1* | 10/2009 | Belady | H05K 7/1497 361/690 |
| 2009/0265032 A1* | 10/2009 | Toscano | G11B 17/225 700/218 |
| 2010/0103614 A1* | 4/2010 | Campbell | H05K 7/20809 361/689 |
| 2011/0064546 A1* | 3/2011 | Merrow | G11B 33/128 414/226.05 |
| 2011/0106298 A1* | 5/2011 | Polyakov | G11B 17/225 700/218 |
| 2012/0023370 A1* | 1/2012 | Truebenbach | G11B 17/225 714/27 |
| 2012/0102374 A1* | 4/2012 | Garcia | G11B 19/048 714/718 |
| 2012/0125028 A1* | 5/2012 | Keisling | H05K 7/20827 62/228.1 |
| 2012/0162906 A1* | 6/2012 | Jai | H05K 7/20745 361/679.53 |
| 2012/0300391 A1* | 11/2012 | Keisling | H05K 7/20745 361/679.46 |
| 2012/0328404 A1* | 12/2012 | Froelich | B23Q 1/623 414/749.1 |
| 2013/0071224 A1* | 3/2013 | Merrow | G11B 33/128 414/806 |
| 2013/0108253 A1* | 5/2013 | Akers | H05K 7/20145 392/485 |
| 2013/0120931 A1* | 5/2013 | Sankar | H05K 7/20745 361/679.48 |
| 2013/0233532 A1* | 9/2013 | Imwalle | F28F 27/02 165/287 |
| 2013/0259628 A1* | 10/2013 | Hirasawa | B65G 47/24 414/754 |
| 2014/0185225 A1* | 7/2014 | Wineland | G06F 1/20 361/679.31 |
| 2014/0273088 A1* | 9/2014 | Winther | G01N 1/312 435/40.52 |
| 2014/0277661 A1* | 9/2014 | Amadio | B29C 67/0088 700/97 |
| 2014/0376176 A1* | 12/2014 | Franz | H05K 7/20772 361/679.47 |
| 2015/0300931 A1* | 10/2015 | Dockrill | G01N 1/312 435/30 |
| 2016/0270262 A1* | 9/2016 | Crawford | H05K 7/20736 |
| 2017/0126505 A1* | 5/2017 | Cencini | H04L 67/22 |
| 2018/0191401 A1* | 7/2018 | Sakalkar | H04B 3/542 |
| 2018/0192539 A1* | 7/2018 | Sakalkar | H05K 7/1492 |

* cited by examiner

SYSTEM AND METHOD FOR DATA CENTER HEAT CONTAINMENT

BACKGROUND

Demand for computational resources from organizations and individuals continues to grow. Increasingly, data centers meet this demand by providing large amounts of data processing and data storage capacity in a concentrated physical space. Some data centers may provide computing as a service, giving customers the flexibility to consume computational resources on an as-needed basis while sparing the customers the financial and administrative burdens of maintaining the underlying physical computing infrastructure. Other data centers may provide large-scale computation for a single organization. In either case, the optimization of data centers becomes increasingly central to computation as data centers grow and proliferate.

Optimizing data centers involves many factors that interrelate in complex ways. For example, computing devices generate waste heat, which may interfere with device performance or reliability. However, dispersal of waste heat from one device may interfere with the operation of other devices in the same data center. In addition, waste heat may make a data center environment unsuitable for human presence, thereby potentially interfering with the work of data center technicians and administrators. Furthermore, cooling systems may impose significant operating costs in the form of energy consumption, as well as costs for acquisition and maintenance.

Traditional data center layouts may place data center equipment in long rows. Unfortunately, disposing of long aisles of waste heat generated in this arrangement may pose significant ongoing expenses for energy and equipment. In some cases, traditional approaches may involve building separate walled-off areas to house some heat-producing devices, posing increased construction costs, requiring increased physical plant footprint, and/or potentially undermining other data center layout criteria (e.g., accessibility, compact infrastructure, and/or optimizing device placement for efficient communication).

Due to the many tradeoffs involved in data center designs and the highly commoditized nature of computing, an improvement to data center design can unlock a tremendous amount of value for data center operators and consumers.

SUMMARY

As will be described in greater detail below, the instant disclosure generally relates to apparatuses, systems, and methods for data center heat containment. In one example, a data center heat containment system may include a group of information technology racks, where (1) each of the information technology racks stores information technology device modules, (2) the group of information technology racks are arranged such that interior faces of the information technology racks define a vertical column of space enclosed by the group of information technology racks, and (3) the information technology racks ventilate air heated by the information technology device modules from the interior faces of the information technology racks into the vertical column of space such that the heated air is contained within the vertical column of space.

In some examples, the base of the vertical column of space defined by the interior faces of the group of information technology racks may approximate a circle. For example, the base of the vertical column of space may approximate a regular polygon (which, in turn, may approximate a circle).

In some embodiments, the interior faces of the group of information technology racks may extend perpendicularly from the base of the group of information technology racks. Alternatively, the interior faces of the group of information technology racks may extend obliquely away from the center of the group of information technology racks such that the vertical column of space defined by the interior faces of the information technology racks expands as the vertical distance from the base of the information technology racks increases.

In some examples, the information technology racks may take in air from the exterior faces of the information technology racks that is cooler than the heated air. In some embodiments, the information technology racks may extend from the floor to the ceiling such that the vertical column of space defined by the plurality of information technology racks is enclosed by the floor and the ceiling.

According to some embodiments, the system may also include an air flow apparatus adapted to move the heated air upward within the vertical column of space. The air flow apparatus may include any of a variety of elements. In some examples, the air flow apparatus may include a fan below the vertical column of space that blows the heated air upward and/or a fan above the vertical column of space that pulls the heated air upward. Additionally or alternatively, the air flow apparatus may include multiple fans positioned to create a vortex with an updraft within the vertical column of space. In some examples, the air flow apparatus may include a conical surface pointing upward within the vertical column of space. In some embodiments, the air flow apparatus may include a liquid cooling pipe that transports heat away from the group of information technology racks and that extends vertically through the vertical column of space. In some examples, the information technology device modules may ventilate the heated air upward from the interior faces of the group of information technology racks.

In some examples, the system may also include a gantry robot that is positioned within the vertical column of space and is adapted to insert and to remove one or more of the information technology device modules from one or more of the information technology racks.

The gantry robot may take any suitable form. In some examples, the gantry robot may be adapted to move a sliding element parallel to the face of an information technology rack, where the face of the information technology rack exposes information technology device modules that are stored by the information technology rack and that thereby connect to and operate within a computing infrastructure. In some examples, the gantry robot may include (1) a track that is coupled to the sliding element and that extends away from the sliding element and toward the face of the information technology rack and (2) an engaging element that is adapted to move along the track and to engage with one or more of the plurality of information technology device modules stored by the information technology rack, such that the engaging element is adapted to insert into the information technology rack and remove from the information technology rack one or more of the plurality of information technology device modules. In some examples, the system may also include a floor track along which the gantry robot is adapted to travel from a position in front of an interior face of a first information technology rack to a position in front of an interior face of a second information technology rack.

In some embodiments, the gantry robot may be adapted to swivel around an axis rising along the vertical column of space. In these embodiments, the gantry robot may engage with a selected information technology rack within the group of information technology racks by first swiveling to face the selected information technology rack.

In addition to the various systems described herein, the instant disclosure presents, by way of example, methods associated with data center heat containment. For example, a method may include positioning a plurality of information technology racks, such that (1) each rack within the group of information technology racks stores information technology device modules, (2) interior faces of the plurality of information technology racks define a vertical column of space enclosed by the plurality of information technology racks, and (3) the group of information technology racks ventilate air heated by the information technology device modules from the interior faces of the group of information technology racks into the vertical column of space such that the heated air is contained within the vertical column of space. In some examples, the base of the vertical column of space defined by the interior faces of the plurality of information technology racks may approximate a circle.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
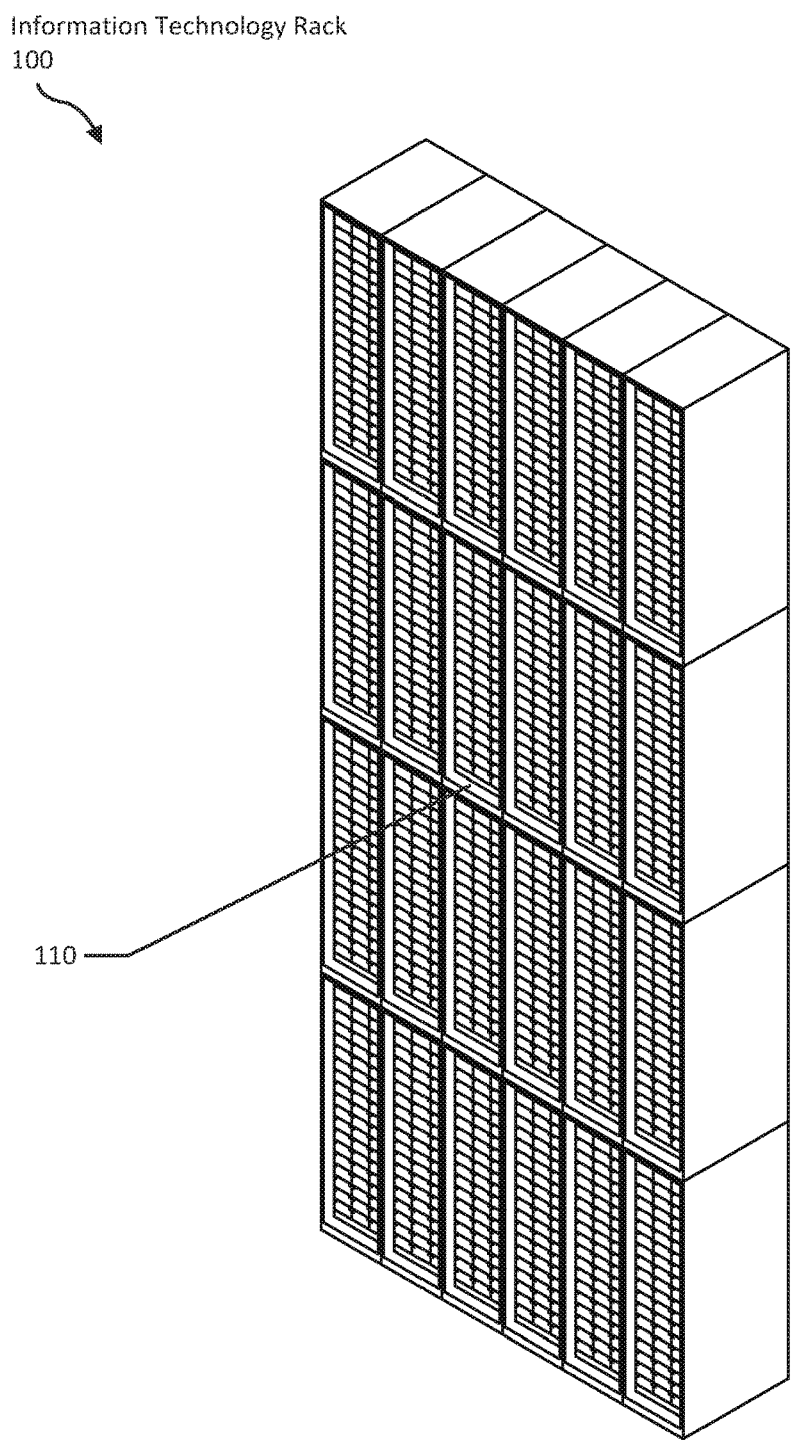
FIG. 1 is a perspective view of an information technology rack.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for data center heat containment. These heat containment systems may use data center racks themselves as walls to contain (e.g., fully surround) air heated by the devices operating within the data center racks. By placing data center racks to create complete (or nearly complete) enclosures and orienting the data center racks (and devices within the data center racks) to ventilate heated air into the enclosures, the systems and methods described herein may efficiently and effectively separate heated air from cool air within data centers, thereby potentially reducing cooling equipment and energy costs. In addition, by creating complete enclosures from data center racks themselves, these systems and methods may avoid costs that would otherwise be incurred by constructing separate walls, rooms, and/or extensions to contain heated air. In some examples, by arranging data center racks to create approximately circular enclosures, these systems and methods may reduce diffusion of heat from the enclosures to the outer environment and/or may improve air flow dynamics to quickly move heated air toward an air return with little additional energy input. Additionally or alternatively, one or more air flow apparatuses operating in connection with the data center racks may improve air flow dynamics to facilitate hot air return.

In some examples, the systems described herein may include gantry robots positioned within the data center rack enclosures that may access devices that may otherwise be inconvenient to access for a human (e.g., due to the heat within the enclosure and/or due to the inconvenience for a human entering or exiting the enclosure and/or the undesirability of opening or closing the enclosure due to potential efficiency loss). In addition, such gantry robots may potentially perform device deployment and/or maintenance tasks more responsively and/or efficiently than would a human technician, thereby potentially improving data center performance.

The following will provide, with reference to FIGS. 1-5, examples of systems for data center heat containment. In addition, the discussion associated with FIGS. 6-9 will provide examples of systems for managing contained heated air in data centers with information technology rack systems. Finally, the discussion corresponding to FIGS. 10-16 will provide examples of systems for interacting with data center devices within heat containment enclosures.

FIG. 1 shows an information technology rack 100 that stores information technology device modules (in a grid formation). As used herein, the term "information technology rack" may refer to any structure for housing multiple information technology device modules. In some examples, an information technology rack may also house and/or provide support for one or more cables that connect to information technology device modules. In some examples, an information technology rack may house information technology device modules in a grid pattern (e.g., shown in FIG. 1 on a face 110 of information technology rack 100). As will be explained in greater detail below, multiple instances of information technology rack 100 may be deployed to create a heat containment system.

As used herein, the term "information technology device module" may refer to any modular device that may include and/or form a part of a computing system and/or an information technology rack. Examples of information technology device modules include, without limitation, servers, power supplies or other forms of power modules, network switches, and battery backup units. In some examples, a heterogeneous set of information technology device modules may operate within a single information technology rack. For example, a single information technology rack may connect servers, power supplies, network switches, and battery backup units within a computing infrastructure. An information technology rack may connect information technology device modules to a computing infrastructure in any suitable manner. For example, an information technology rack may include one or more cables and/or connectors that connect to stored information technology device modules and that transmit data and/or power between information technology device modules and/or between an information technology device module and another system.

Figure 2:
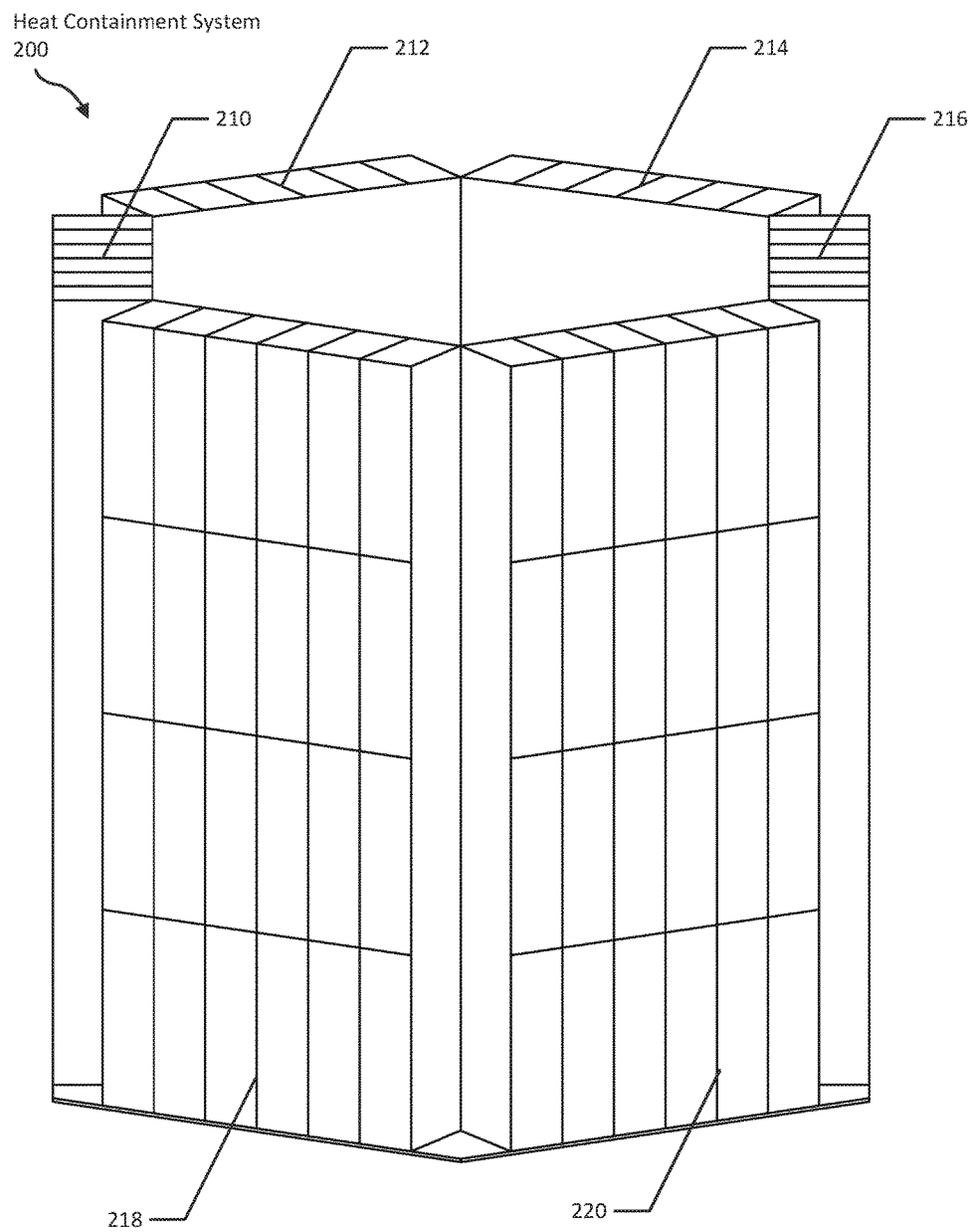
FIG. 2 is a perspective view a system of information technology racks.
Figure 3:
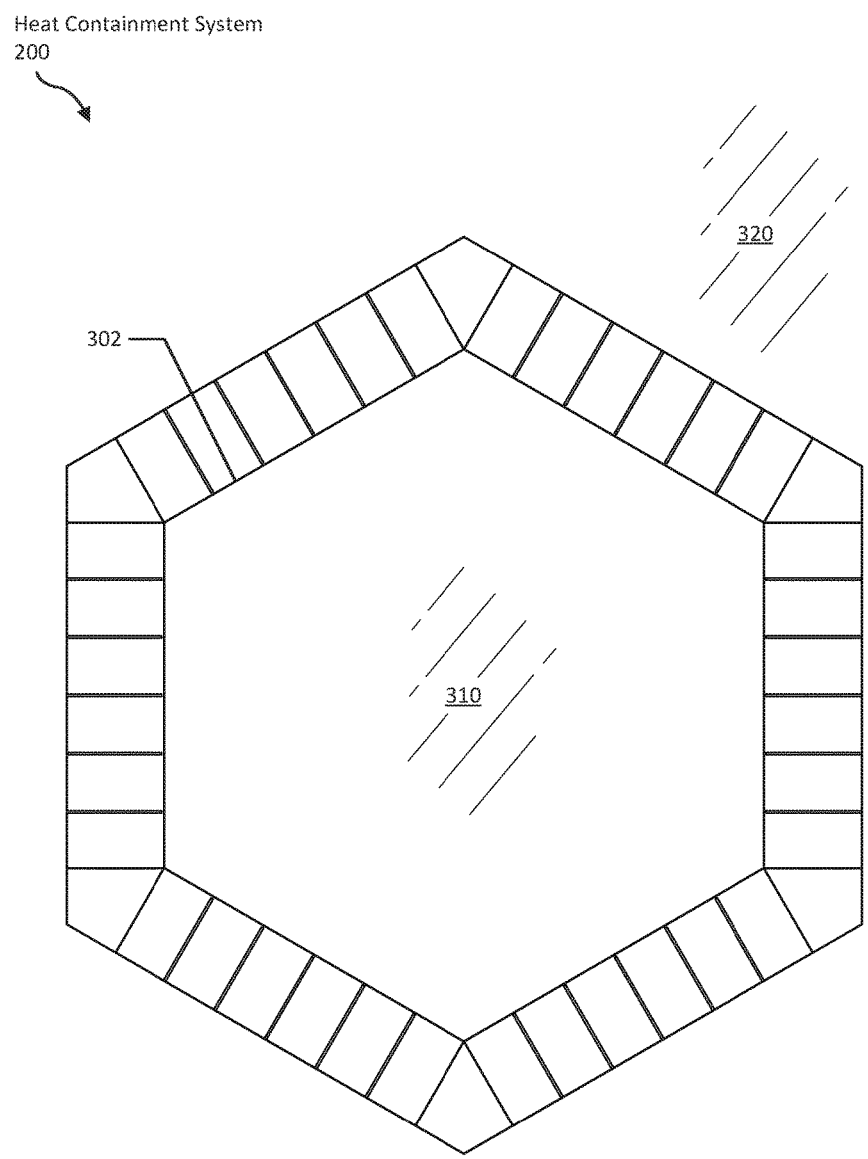
FIG. 3 is a top view of a system of information technology racks.

FIGS. 2-3 show a heat containment system 200. As shown in FIG. 2, heat containment system 200 may include a group of information technology racks—namely, racks 210, 212, 214, 216, 218, and 220 (e.g., representing instances of information technology rack 100). Each rack may store information technology device modules. Information technology racks 210, 212, 214, 216, 218, and 220 may be arranged such that the interior faces of the racks define a vertical column of space enclosed by the racks. Information technology racks 210, 212, 214, 216, 218, and 220 may ventilate air heated by the information technology device modules that they store from the interior faces of the racks into the vertical column of space defined by the racks such that the heated air is contained within the vertical column of space. For example, as shown in FIG. 3, racks 210, 212, 214, 216, 218, and 220 may define a space 310 into which heated air from the information technology device modules stored by the racks may ventilate. Space 310 may be enclosed by racks 210, 212, 214, 216, 218, and 220 and thereby physically separated by the racks from a space 320 surrounding the exterior faces of racks 210, 212, 214, 216, 218, and 220.

The heat containment system may enclose a space approximating any suitable shape. For example, as shown in FIG. 3, a base 302 of the vertical column of space defined by the interior faces of heat containment system 200 may approximate a hexagon. As will be explained in greater detail below, the interior faces of the heat containment system may define any other suitable shape for containing heated air (e.g., a square, a triangle, a rectangle, etc.).

The vertical column of space may encompass any suitable volume. In some examples, the information technology racks may be 40 feet tall, 80 feet tall, or taller. Thus, the vertical column of space may include a large volume of air.

Figure 4:
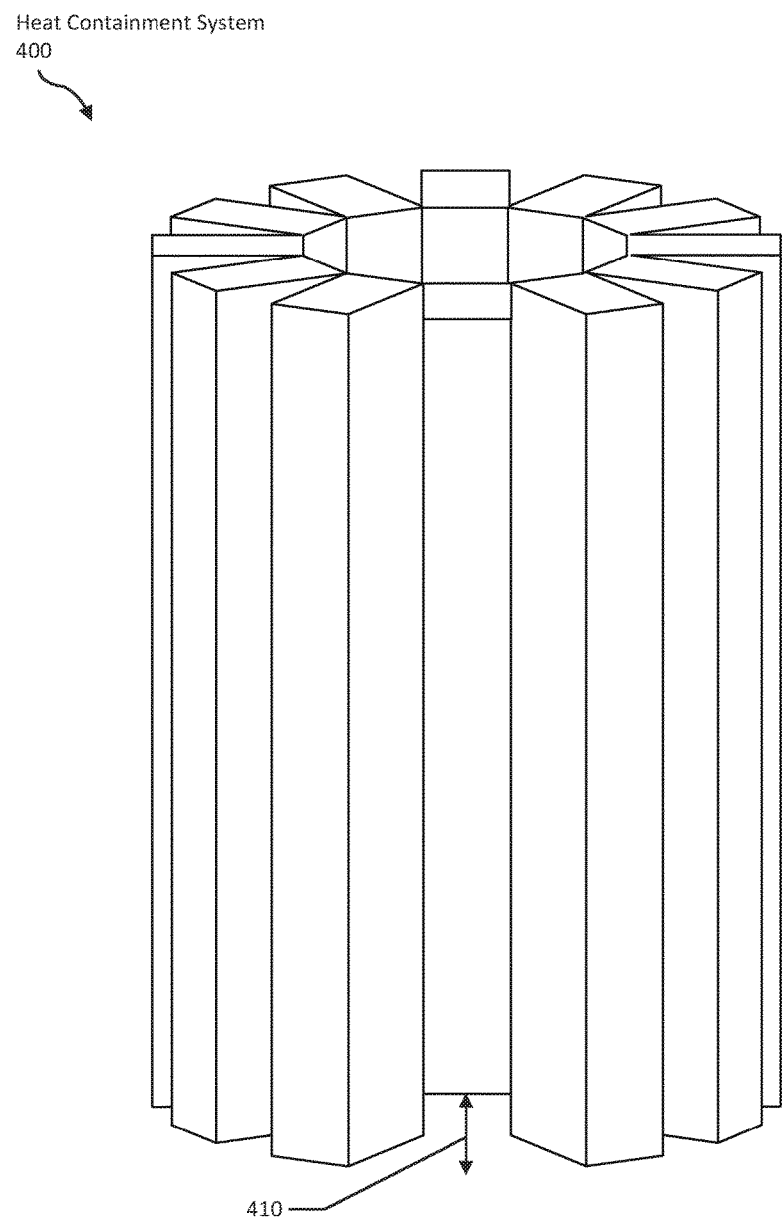
FIG. 4 is a perspective view of a system of information technology racks.
Figure 5:
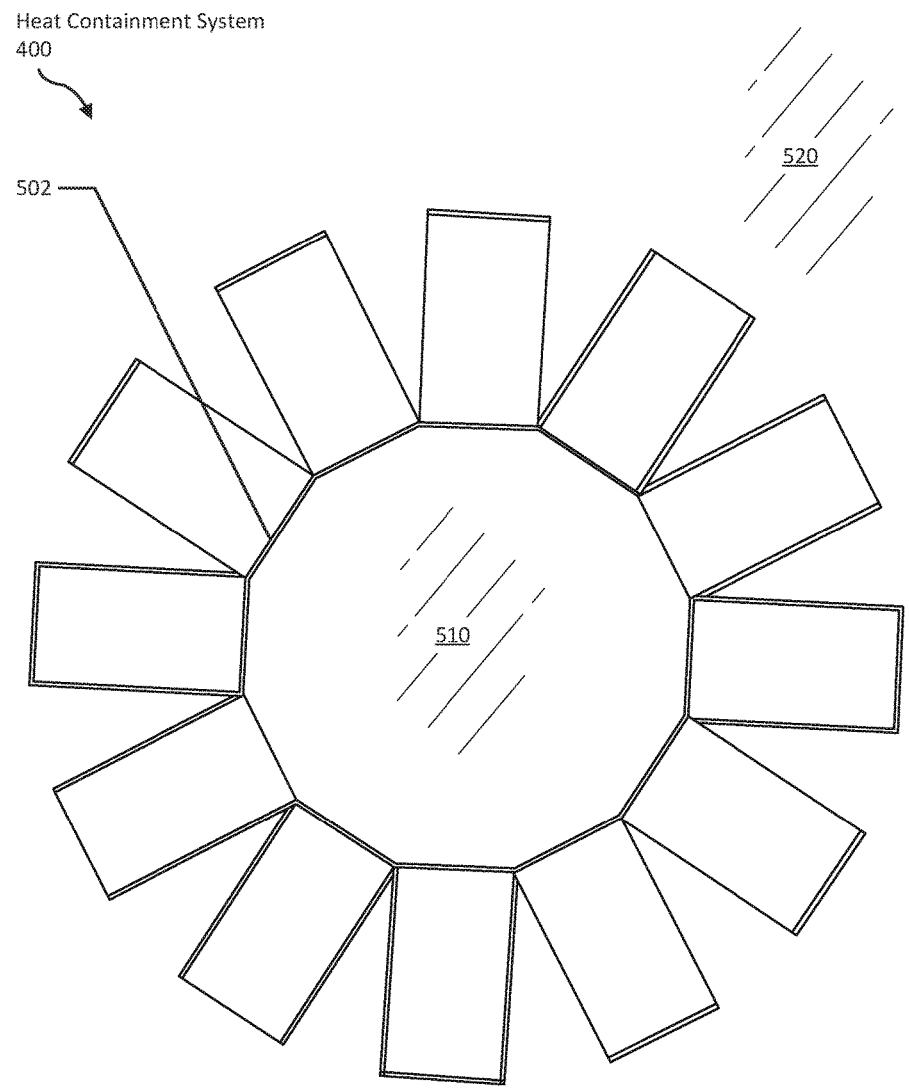
FIG. 5 is a top view of a system of information technology racks.

As another example, FIGS. 4 and 5 illustrate a heat containment system 400. As shown in FIGS. 4 and 5, heat containment system 400 may include twelve information technology racks. As illustrated in FIG. 5, the twelve information technology racks may collectively define an enclosed volume of space 510 into which heated air may be ventilated and which may be separated from an exterior space 520 by the twelve information technology racks. A base 502 of the volume of space 510 may approximate a dodecahedron. As shown in FIG. 4, the enclosure created by the twelve information technology racks may not be complete. For example, a gap 410 defined by one of the twelve information technology racks and an underlying floor may permit objects (e.g., information technology device modules) to pass in and out of the enclosure. However, as will be discussed in greater detail below, in various examples the enclosure defined by the group of information technology device racks that form a heat containment system may be approximately complete.

In various examples, the heat containment systems described herein may allow passage of objects (e.g., information technology device modules and/or robots for installing and/or removing information technology device modules) and/or people into and/or out of the enclosures defined by the heat containment systems. For example, as discussed above, gap 410 may allow one or more information technology device modules to pass into and/or out of heat containment system 400. In some examples, gap 410 may be fitted with a door that may be closed to contain heat within heat containment system 400 when no objects are being passed into or out of heat containment system 400. In some examples, a conveyor system may carry information technology device modules via gap 410 into and/or out of heat containment system 400. For example, a robot may retrieve information technology device modules from the conveyor system for installation into the information technology racks and/or may place information technology device modules removed from the information technology racks on the conveyor system to be carried out of the heat containment system for disposal, for repairs, or for installation in an information technology rack that is not a part of the heat containment system.

In some examples, one of the information technology racks forming a heat containment system may act as a portal between the inside and the outside of the heat containment system. For example, the information technology rack may be adapted to swing on hinges (e.g., acting as a door), temporarily allowing the ingress and egress of people and/or devices. In some examples, the information technology rack may be installed on vertical rails along which the information technology rack may slide (e.g., upward off the floor or downward through an aperture in the floor), temporarily allowing the ingress and egress of people and/or devices. In some examples, a hatch within the heat containment system may allow the ingress and egress of people and/or devices.

While FIGS. 2-3 illustrate a hexagonal configuration and FIGS. 4-5 illustrate a dodecagonal configuration, other configurations are possible. In some examples, the base of the interior of the heat containment system may take the form of any substantially closed figure (e.g., symmetric or asymmetric). In some examples, the base of the interior of the heat containment system may define a convex figure. In some examples, the base of the interior of the heat containment system may approximate a regular polygon (e.g., the hexagon of FIGS. 2-3, the dodecagon of FIGS. 4-5, an icosagon, etc.). In some embodiments, the base of the interior of the heat containment system may approximate a circle. For example, the heat containment system may approximate a circular configuration by approximating a regular polygon. As may be appreciated, regular polygons with a greater number of sides may more effectively approximate a circle. The heat containment system may approximate a circular configuration to any suitable degree according to any suitable metric. For example, the heat containment system may approximate a circular configuration according to the isoperimetric quotient of the base of the interior of the heat containment system. The heat containment system may achieve roundness according to the isoperimetric quotient to any suitable degree, including, e.g., 0.8 or greater, 0.85 or greater, 0.9 or greater, 0.95 or greater, 0.975 or greater, or 0.99 or greater. The approximate roundness of the heat containment system may provide various advantages. For example, an approximately round enclosure may minimize a surface-area-to ratio of the enclosure, thereby potentially reducing dissipation of heat out of the enclosure. In addition, as will be explained in greater detail below, systems described herein may facilitate the movement of the heated air within the enclosure to an air return. In some examples, an approximately circular enclosure may facilitate such movement (e.g., by facilitating the creation of a vortex with an updraft).

While FIGS. 2-5 illustrate the interior faces of the information technology racks extending perpendicularly from the base of the plurality of information technology racks, in some examples the interior faces of the information technology racks may extend upward at a bias. For example, the interior faces of the group of information technology racks may extend obliquely away from a center of the group of information technology racks such that the vertical column of space defined by the interior faces of the groups of information technology racks expands as a vertical distance from the base of the group of information technology racks increases. The bias of the interior faces of the information technology racks may be achieved in any suitable manner. In some examples, opposite pairs of the information technology racks may be canted to form an approximate V shape when viewed from the side. In some examples, such an arrangement may facilitate favorable heat distribution and/or air flow within the enclosed space.

As shown in FIGS. 2-5, the information technology racks in heat containment systems 200 and 400 may provide complete or approximately complete lateral enclosures for heated air (i.e., enclosing the vertical column of space defined by the respective heat containment systems 200 and 400 excepting for at the base and the top of the vertical column of space). By providing a complete or approximately complete enclosure, these systems may more effectively separate heated air from cooler air. In addition, by using the information technology racks themselves as physical enclosure barriers, these systems may avoid the material and construction costs of creating separate enclosure barriers and may reduce the physical footprint of the data center by reducing the consumption of space within the data center by auxiliary materials. Accordingly, in some examples, substantially all lateral enclosure surface of a heat containment system may be composed of information technology racks (rather than, e.g., gaps in the surface and/or walls, doors, and/or other materials other than the information technology racks themselves). For example, the lateral enclosure surface of a heat containment system (e.g., the enclosure surface aside from the bottom or top of the enclosed volume) may be at least 90% information technology rack surface, at least 95% information technology rack surface, at least 98% information technology rack surface, or at least 99% information technology rack surface.

In some examples, a floor and/or a ceiling may enclose the vertical column of space and/or define the vertical column of space enclosed by a heat containment system. For example, the group of information technology racks may extend from a floor to a ceiling such that the vertical column of space defined by the group of information technology racks in enclosed by the floor and the ceiling. In some examples, as will be discussed in greater detail below, the floor and/or ceiling may have one or more apertures. For example, one or more fans under the floor (or composing portions of the floor) may blow air upward in the contained area. Additionally or alternatively, one or more fans positioned above the contained area may draw air within the contained area upward. In some examples, an air return in the ceiling may direct the heated air out of the enclosure (e.g., to outside the data center and/or to a cooling system). Additionally or alternatively, the air return may divert the heated air to mix with air from the outside (e.g., cold air) to produce air of a desired temperature. In some examples, the top of the heat containment system may be coupled to and/or feed into an air return apparatus.

In some embodiments, the group of information technology racks may take in air from the exterior faces of the group of information technology racks. The air taken in may be cooler than the heated air ventilated by the interior faces of the group of information technology racks. Using FIG. 3 as an example, air in space 320 may be relatively cool (e.g., cooled by a cooling system and/or simply unheated) and may be taken in through the exterior faces of the six information technology racks of heat containment system 200. Likewise, using FIG. 5 as an example, air in space 520 may be cooler than air in space 510 and may be taken in through exterior faces of the twelve information technology racks of heat containment system 400.

Figure 6:
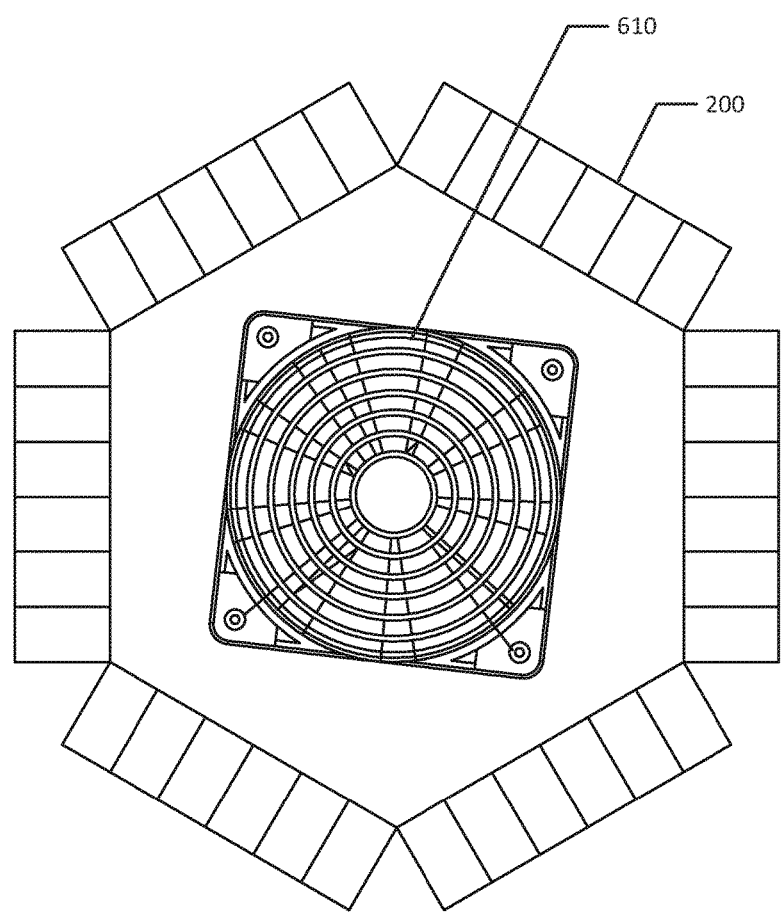
FIG. 6 is a top view of a system of information technology racks with a fan.

In some examples, the data center heat containment system may include an air flow apparatus adapted to move the heated air upward within the vertical column of space enclosed by the group of information technology racks. The air flow apparatus may include any of a variety of elements. For example, FIG. 6 illustrates heat containment system 200 and a fan 610 positioned at the base of heat containment system 200 to blow the heated air upward.

Figure 7:
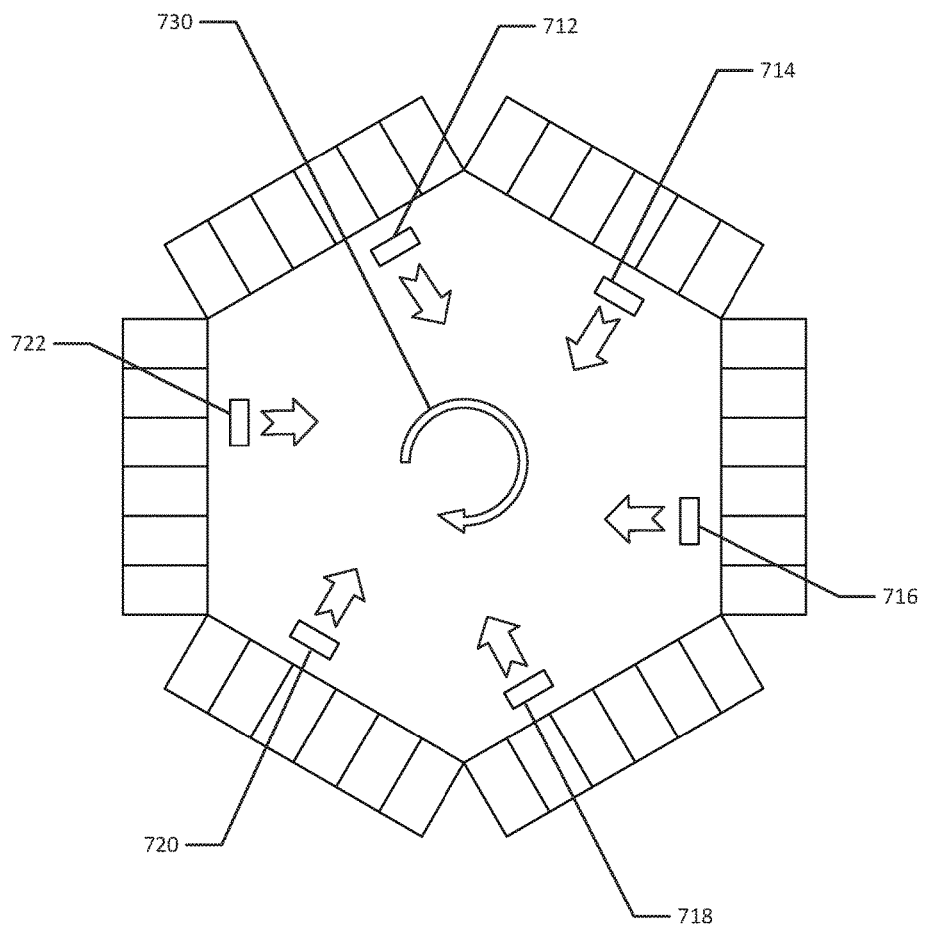
FIG. 7 is a top view of a system of information technology racks with fans.

FIG. 7 illustrates multiple fans positioned within heat containment system 200. As shown in FIG. 7, fans 712, 714, 716, 718, 720, and 722 may be positioned to create a vortex 730 of air with an updraft within the vertical column of space. In this manner, heat containment system 200 may quickly and efficiently facilitate the circulation of heated air to an air return.

Figure 8:
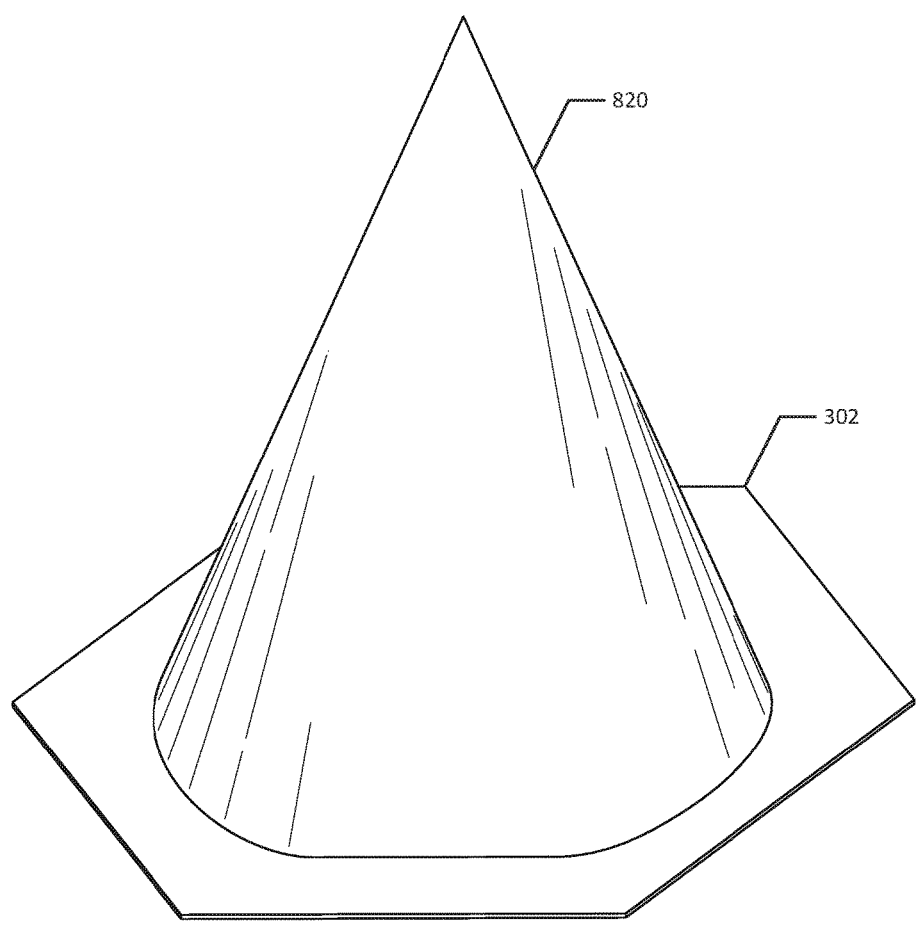
FIG. 8 is a perspective view of an interior space of a system of information technology racks with a cone.

FIG. 8 illustrates a cone 820 placed on base 302 of the interior of heat containment system 200. In some examples, a conical surface pointing upward within the vertical column of space, such as that provided by cone 820, may facilitate an updraft of the heated air.

Figure 9:
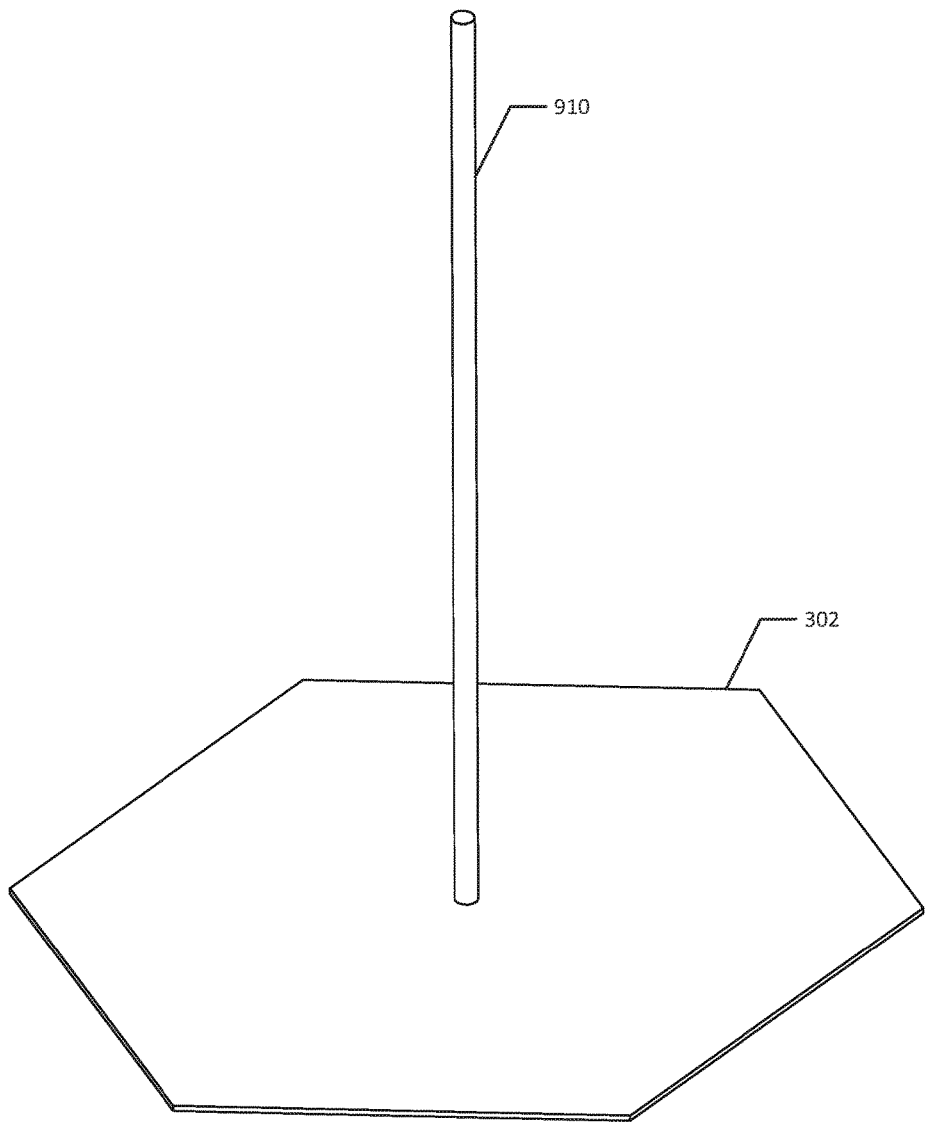
FIG. 9 is a perspective view of an interior space of a system of information technology racks with a liquid cooling pipe.

FIG. 9 illustrates a liquid cooling pipe 910 extending vertically from base 302 of the interior of heat containment system 200. Liquid cooling pipe 910 may transport heat away from the group of information technology racks. For example, a liquid cooling system engaged with and/or integrated within one or more of the group of information technology racks may transport heat to liquid cooling pipe 910. Liquid cooling pipe 910 may then transport the heat away from the group of information technology racks. In some examples, liquid cooling pipe 910 may, in addition to directly transporting heat away from the group of information technology racks via the liquid cooling system, also facilitate an updraft of the heated air within heat containment system 200 (e.g., to an air return).

In some examples, the group of information technology racks and/or the information technology device modules stored within the group of information technology racks may be configured to contribute to an updraft within the vertical column of space defined by the group of information technology racks. For example, the information technology device modules may ventilate the heated air upward from the interior faces of the plurality of information technology racks (e.g., via vent openings that direct the heated air upward and/or via an orientation of the information technology device modules that directs ventilation of heated air upward). In various examples, the information technology device modules may ventilate the heated air with an upward component, but not directly upward. For example, the information technology device modules may ventilate the heated air at least 20 degrees upward from the base of the heat containment system, at least 30 degrees upward, at least 45 degrees upward, or at least 60 degrees upward. In some examples, the information technology device modules may ventilate the heated air at a horizontal bias (e.g., relative to the normal of the face of the information technology devices modules and/or the respective information technology racks storing the information technology device modules) such that the ventilated air creates an updraft (e.g., by creating a vortex with an updraft). For example, instead of ventilating the heated air directly toward the center of the hot air containment area, one or more of the information technology device modules may ventilate the heated air at a tangent of a circle around the center of the hot air containment area, thereby creating and/or contributing to a vortex of air.

In some examples, the air flow apparatus may remove heated air from the heat containment system by creating a pressure differential between the air within the heat containment system and the air in a connected area. For example, a duct system may convey the heated air out of the heat containment system and to an area for the disposal of heated air (e.g., to the exterior of a data center, to an air cooling system, etc.). Accordingly, the air flow apparatus may include one or more pumps and/or fans that reduce the air pressure in the duct system, thereby drawing the heated air from the area within the heat containment system.

Figure 10:
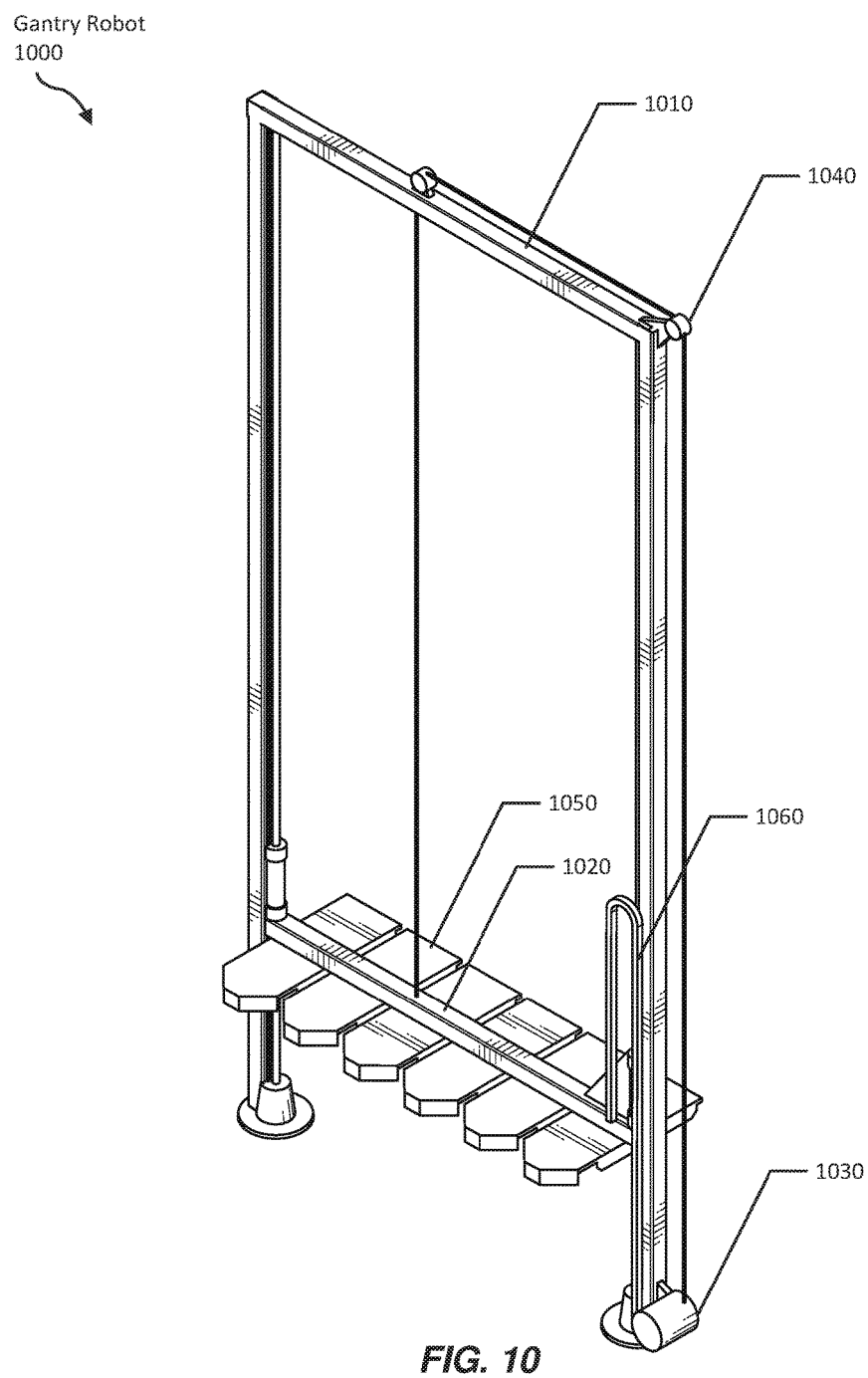
FIG. 10 is a perspective view of a gantry robot.

FIG. 10 illustrates a gantry robot 1000. The term "gantry," as used herein, may refer to any rigid structure adapted to provide movement for an operative assembly across an area defined by the rigid structure. Accordingly, the term "gantry robot," as used herein, may refer to any gantry adapted to provide such movement for an operative assembly to perform programmable, automated tasks. For example, gantry robot 1000 may be adapted to move a sliding element 1020 parallel to the face of an information technology rack that exposes information technology devices that are stored by the information technology rack and that thereby connect to and operate within a computing infrastructure. As used herein, the term "computing infrastructure" may refer to any collection of devices and/or components that may collectively provide computational resources. A computing infrastructure with modular components may be used in any of a variety of contexts. In some examples, a computing infrastructure may provide computation in a cloud computing environment. Additionally or alternatively, a computing infrastructure may provide computation in a parallel computing environment. In some examples, a computing infrastructure may represent a collection of underlying physical computing resources that may be allocated and/or virtualized to provide one or more logical and/or virtual computing resources.

In one example, a motor 1030 may drive sliding element along a frame 1010 of gantry robot 1000. For example, motor 1030 may drive a pulley 1040 to move sliding element 1020 up or down frame 1010 of gantry robot 1000.

In some examples, a track may be coupled to sliding element 1020. The track may extend away from sliding element 1020 and toward the face of the information technology rack. For example, sliding element 1020 may support one or more trays, including a tray 1050. In this example, tray 1050 may include a track (e.g., on the underside of tray 1050, not visible in FIG. 10) that runs perpendicular to sliding element 1020. Thus, the track may be coupled to sliding element 1020 via tray 1050.

As will be explained in greater detail below, gantry robot 1000 may also include an engaging element (e.g., on the underside of tray 1050, not visible in FIG. 10) that is adapted to move along the track and to engage with one or more of the information technology device modules stored by the information technology rack, such that the engaging element is adapted to insert into the information rack and remove from the information technology rack one or more of the information technology device modules.

As shown in FIG. 10, gantry robot 1000 may additionally include a power conduit 1060 that may convey power to the engaging element (e.g., via sliding element 1020 and/or tray 1050) to enable the engaging element to move along the track and/or engage with one or more information technology device modules.

Gantry robot 1000 may remove or insert an information technology device module in any of a variety of contexts. For example, gantry robot 1000 may remove an information technology device module from an information technology rack in response to a signal from the information technology rack that the information technology device module is to be removed (e.g., a signal indicating that the information technology device module is defective). Likewise, gantry robot 1000 may insert an information technology device module into an information technology rack in response to a signal from the information technology rack that a slot within the information technology rack is available. In some examples, gantry robot 1000 may receive instructions to insert, remove, move, and/or replace modules from a data center coordination system that maintains a map of information technology device modules and information technology racks within a data center.

Figure 11:
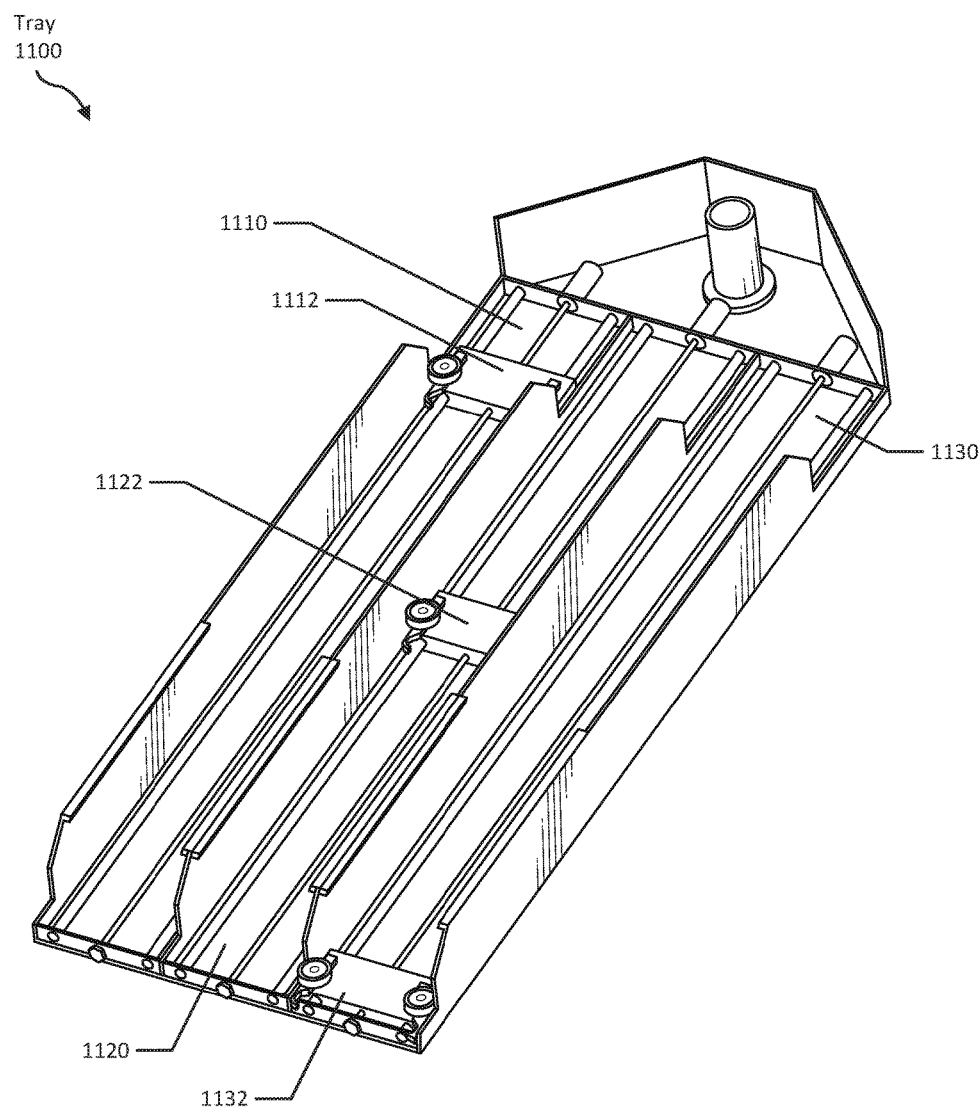
FIG. 11 is a perspective view of an underside of a tray for a gantry robot.

FIG. 11 shows the underside of a tray 1100 (e.g., corresponding to tray 1050 depicted in FIG. 10). As shown in FIG. 11, tray 1100 may include a track 1110, a track 1120, and a track 1130, along which may slide engaging elements 1112, 1122, and 1132, respectively. In one example, each track may include multiple rails (e.g., that run through corresponding channels in the engaging elements).

Figure 12:
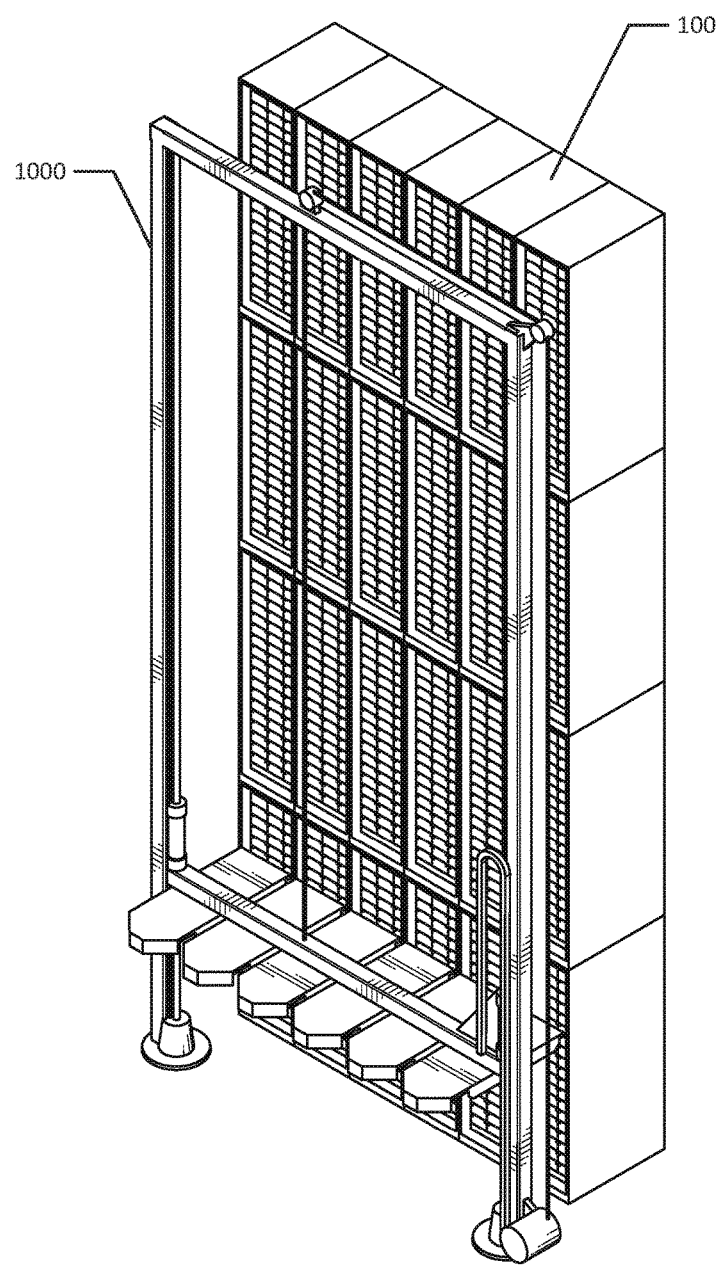
FIG. 12 is a perspective view of an information technology rack with a gantry robot.

FIG. 12 shows gantry robot 1000 positioned in front of information technology rack 100. As seen in FIG. 12, gantry robot 1000 may be positioned in front of information technology rack 100 such that the six trays of gantry robot 1000 are aligned with information technology rack 100. In this manner, gantry robot 1000 may be able to access multiple information technology device modules at one time. For example, each of the trays 1100 may have three tracks (e.g., as shown in FIG. 11), each with an engaging element. Accordingly, the six trays may collectively include 18 tracks. While some examples discussed herein show a gantry robot with six trays, each with three tracks, it may be appreciated that other configurations may be employed. Generally, any suitable number of trays may be coupled to the sliding element of a single gantry robot, and a tray may include multiple tracks carrying multiple engaging elements. By way of additional examples, the gantry robot may use a single tray with three tracks, a single tray with six tracks, three trays each with three tracks, nine trays each with two tracks, or three trays each with six tracks. Thus, in various examples, gantry robot 1000 may deploy an entire row of modules (e.g., 18 modules) at once. Additionally or alternatively, gantry robot 1000 may selectively deploy and/or remove modules to or from any of the 18 corresponding slots at a given position for sliding element 1020. In this manner, systems described herein may rapidly deploy, reconfigure, replace, and/or remove targeted modules in data center racks.

Figure 13:
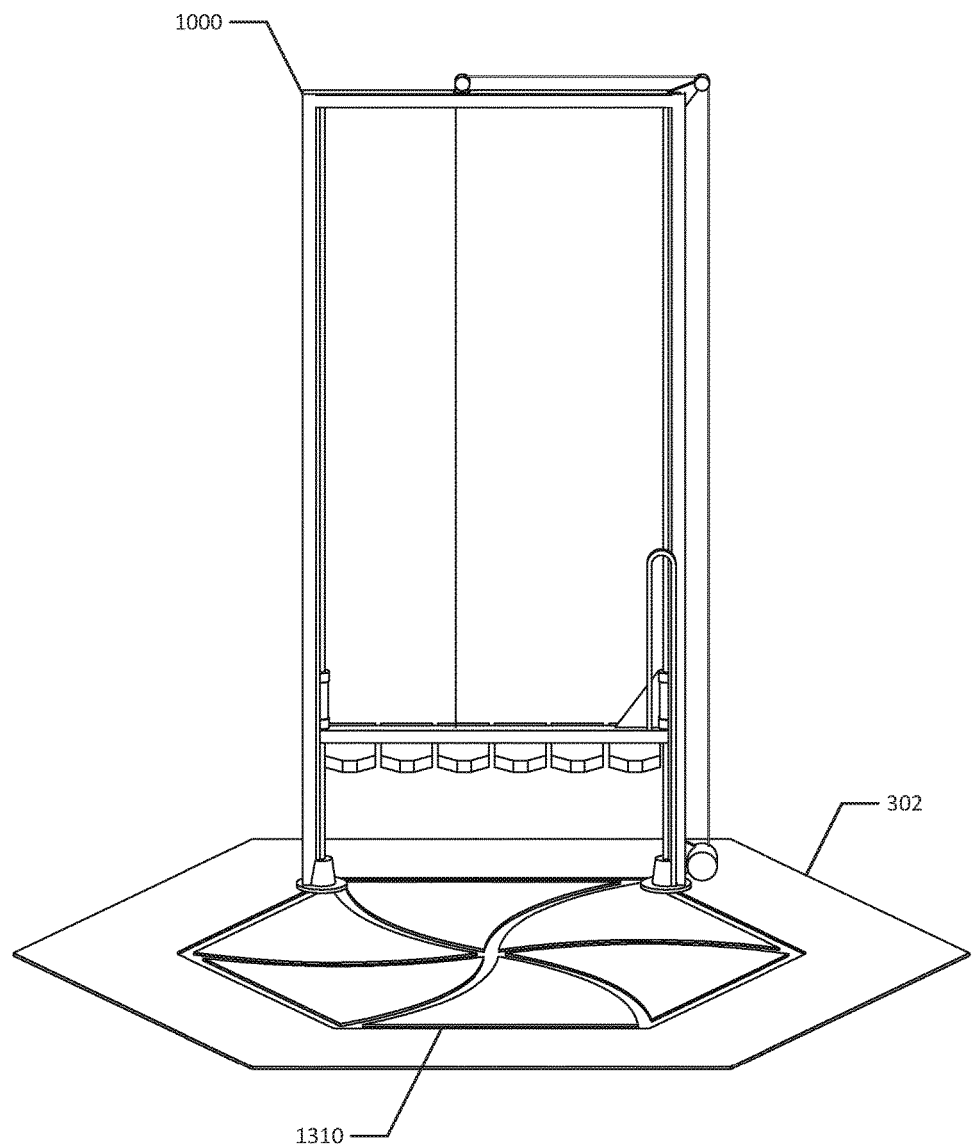
FIG. 13 is a perspective view of an interior space of a system of information technology racks with a gantry robot on tracks.
Figure 14:
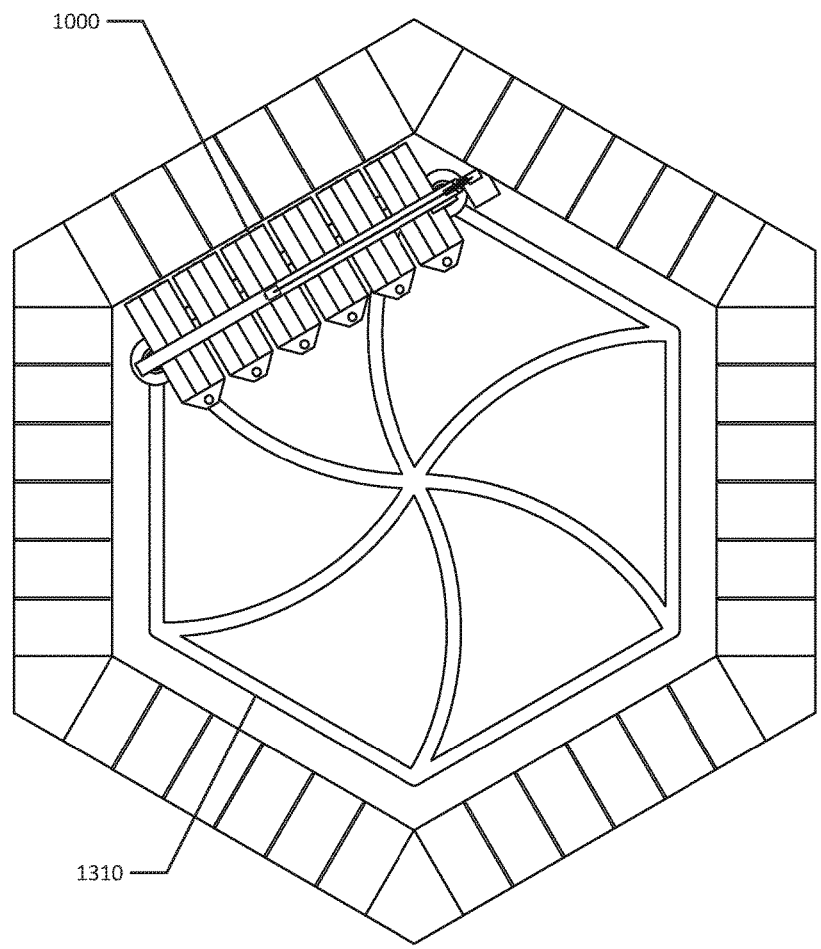
FIG. 14 is a top view of a system of information technology racks with a gantry robot on tracks.

FIGS. 13-14 show gantry robot 1000 on a track system 1310 in base 302 of heat containment system 200. In some examples, gantry robot 1000 may be adapted to travel along track system 1310 such that gantry robot 1000 can travel from one information technology rack to another. For example, track system 1310 may provide a hub-and-spoke system whereby the left leg of gantry robot 1000 can swing toward the hub, allowing gantry robot 1000 to travel to a target information technology rack (e.g., with right other leg) and then to swing the left leg toward the target information technology rack.

Figure 15:
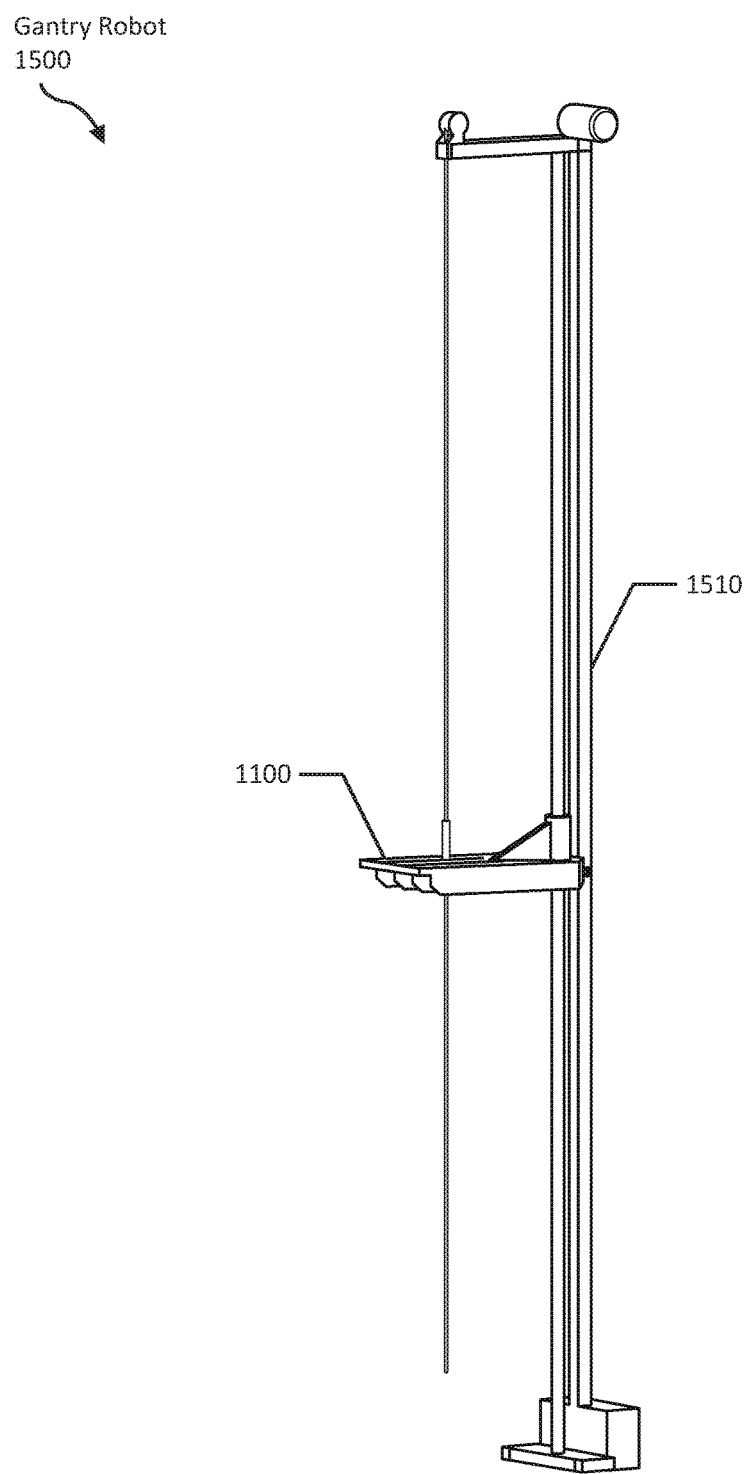
FIG. 15 is a perspective view of a gantry robot.
Figure 16:
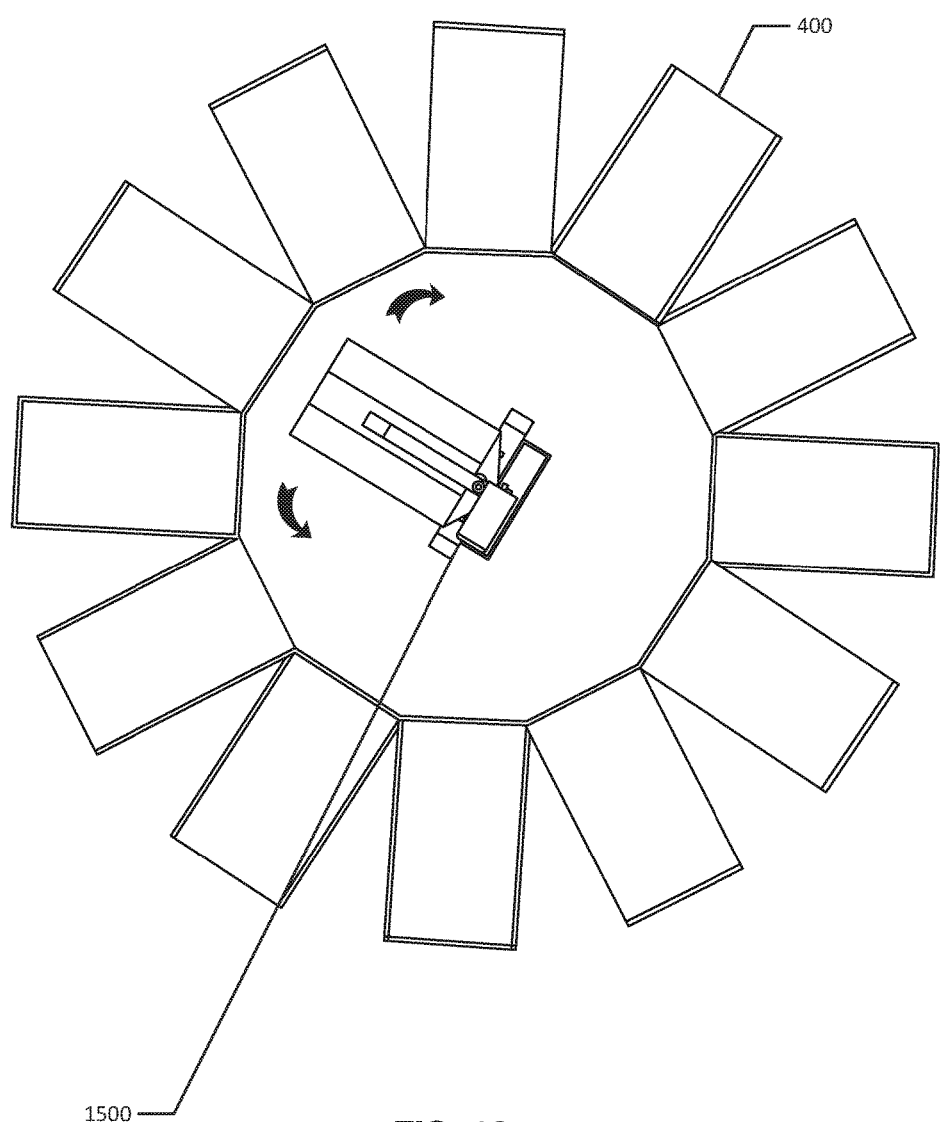
FIG. 16 is a top view of a system of information technology racks with a gantry robot.

FIG. 15 shows a gantry robot 1500. As shown in FIG. 15, gantry robot 1500 may include a pole 1510 and tray 1100. In some examples, gantry robot 1500 may be adapted to swivel around pole 1510. For example, FIG. 16 illustrates gantry robot 1500 within the enclosure of heat containment system 400. As shown in FIG. 16, gantry robot 1500 may swivel around an axis rising along the vertical column of space within heat containment system 400. Gantry robot 1500 may thereby swivel to face a selected information technology rack and then engage with the selected information technology rack.

While the foregoing discussion provides examples of a single gantry robot operating within a heat containment system, in some examples multiple robots may operate within a heat containment system. In some examples, the disparate robots may be adapted to remove and/or install different types of information technology device modules (e.g., the disparate robots may be differently tooled, providing the ability to interface with and/or grasp differently shaped information technology device modules). Additionally or alternatively, multiple robots may perform tasks simultaneously and/or may provide operative redundancy should one of the robots fail.

A method for manufacturing, assembling, using, adjusting, or otherwise configuring or creating the systems described herein may include positioning a group of information technology racks such that (1) each rack within the group of information technology racks stores information technology device modules, (2) interior faces of the group of information technology racks define a vertical column of space enclosed by the group of information technology racks, and (3) the group of information technology racks ventilate air heated by the information technology device modules from the interior faces of the group of information technology racks into the vertical column of space such that the heated air is contained within the vertical column of space. Using FIGS. 2 and 3 as an example, racks 210, 212, 214, 216, 218, and 220 may be positioned such that racks 210, 212, 214, 216, 218, and 220 define space 310 enclosed by the racks and such that racks 210, 212, 214, 216, 218, and 220 ventilate air heated by the information technology device modules stored in the racks from the interior faces of the racks such that the heated air is contained within space 310. In some examples, the base of the vertical column of space defined by the interior faces of the racks may approximate a circle (e.g., by approximating a regular polygon, such as the hexagonal base 302).

In some examples, the group of information technology racks may be coupled together (e.g., with hinges, brackets, adhesive, etc.). In some examples, a covering material (e.g., a shell spanning from the edge of one information technology rack to the edge of an adjacent information technology rack) may block air from escaping via any small cracks between the information technology racks.

As discussed throughout the instant disclosure, the disclosed methods, systems, and devices may provide one or more advantages over traditional data center configurations. By placing data center racks to create complete (or nearly complete) enclosures and orienting the data center racks (and devices within the data center racks) to ventilate heated air into the enclosures, the systems and methods described herein may efficiently and effectively separate heated air from cool air within data centers, thereby potentially reducing cooling equipment and energy costs. In addition, by creating complete enclosures from data center racks themselves, these systems and methods may avoid costs that would otherwise be incurred by constructing separate walls, rooms, and/or extensions to contain heated air. In some examples, by arranging data center racks to create approximately circular enclosures, these systems and methods may reduce diffusion of heat from the enclosures to the outer environment and/or may improve air flow dynamics to quickly move heated air toward an air return with little additional energy input. Additionally or alternatively, one or more air flow apparatuses operating in connection with the data center racks may improve air flow dynamics to facilitate hot air return.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A data center heat containment system comprising:
   a plurality of information technology racks, wherein:
      each rack within the plurality of information technology racks stores a plurality of information technology device modules;
      the plurality of information technology racks are arranged such that interior faces of the plurality of information technology racks define a vertical column of space enclosed by the plurality of information technology racks; and
      the plurality of information technology racks ventilate air heated by the plurality of information technology device modules from the interior faces of the plurality of information technology racks into the vertical column of space such that the heated air is contained within the vertical column of space; and an air flow apparatus comprising a cone including a conical surface such that the conical surface points upward within the vertical column of space.

2. The data center heat containment system of claim 1, wherein a base of the vertical column of space defined by the interior faces of the plurality of information technology racks approximates a circle.

3. The data center heat containment system of claim 2, wherein the base of the vertical column of space approximates a circle by approximating a regular polygon.

4. The data center heat containment system of claim 2, wherein the cone is placed on the base of the vertical column of space.

5. The data center heat containment system of claim 1, wherein the interior faces of the plurality of information technology racks extend perpendicularly from a base of the plurality of information technology racks.

6. The data center heat containment system of claim 1, wherein the interior faces of the plurality of information technology racks extend obliquely away from a center of the plurality of information technology racks such that the vertical column of space defined by the interior faces of the plurality of information technology racks expands as a vertical distance from a base of the plurality of information technology racks increases.

7. The data center heat containment system of claim 1, wherein the plurality of information technology racks take in air from exterior faces of the plurality of information technology racks that is cooler than the heated air.

8. The data center heat containment system of claim 1, wherein the plurality of information technology racks extend from a floor to a ceiling such that the vertical column of space defined by the plurality of information technology racks is enclosed by the floor and the ceiling.

9. The data center heat containment system of claim 1, wherein the air flow apparatus is adapted to move the heated air upward within the vertical column of space.

10. The data center heat containment system of claim 9, wherein the air flow apparatus further comprises at least one of:
  a fan below the vertical column of space that blows the heated air upward; and
  a fan above the vertical column of space that draws the heated air upward.

11. The data center heat containment system of claim 9, wherein the air flow apparatus further comprises a plurality of fans positioned to create a vortex with an updraft within the vertical column of space.

12. The data center heat containment system of claim 9, wherein the air flow apparatus further comprises a liquid cooling pipe that transports heat away from the plurality of information technology racks and that extends vertically through the vertical column of space.

13. The data center heat containment system of claim 1, wherein the plurality of information technology device modules ventilate the heated air upward from the interior faces of the plurality of information technology racks.

14. The data center heat containment system of claim 1, further comprising a gantry robot that is positioned within the vertical column of space and is adapted to insert and to remove one or more of the information technology device modules from one or more of the information technology racks.

15. The data center heat containment system of claim 14, wherein the gantry robot is adapted to swivel around an axis rising along the vertical column of space, wherein the gantry robot engages with a selected information technology rack within the plurality of information technology racks by first swiveling to face the selected information technology rack.

16. A method comprising:
  positioning a plurality of information technology racks, such that:
    each rack within the plurality of information technology racks stores a plurality of information technology device modules;
    interior faces of the plurality of information technology racks define a vertical column of space enclosed by the plurality of information technology racks; and
    the plurality of information technology racks ventilate air heated by the plurality of information technology device modules from the interior faces of the plurality of information technology racks into the vertical column of space such that the heated air is contained within the vertical column of space; and
  positioning an air flow apparatus within the vertical column of space, the air flow apparatus comprising a cone including a conical surface such that the conical surface points upward within the vertical column of space.

17. The method of claim 16, wherein a base of the vertical column of space defined by the interior faces of the plurality of information technology racks approximates a circle.

18. A data center heat containment system comprising:
  a plurality of information technology racks, wherein:
    each rack within the plurality of information technology racks stores a plurality of information technology device modules; and
    the plurality of information technology racks are arranged such that interior faces of the plurality of information technology racks expose the plurality of information technology device modules and define a vertical column of space enclosed by the plurality of information technology racks; and
    the plurality of information technology racks ventilate air heated by the plurality of information technology device modules from the interior faces of the plurality of information technology racks into the vertical column of space such that the heated air is contained within the vertical column of space;
  a gantry robot positioned within the vertical column of space; and
  a floor track system including a hub, the gantry robot engaged in the floor track system and adapted to travel from a position in front of an interior face of a first information technology rack to a position in front of an interior face of a second information technology rack, the travel including:
    a left leg of the gantry robot swinging towards the hub allowing a right leg of the gantry robot to travel from the position in front of the interior face of the first information technology rack to the position in front of the interior face of the second information technology rack; and
    subsequent to the left leg of the gantry robot swinging towards the hub, the left leg of the gantry robot swinging towards the position in front of the interior face of the second information technology rack.

19. The data center heat containment system of claim 18, wherein the gantry robot comprises:
  a sliding element adapted to move parallel to an interior face of an information technology rack;

a track that is coupled to the sliding element and that extends away from the sliding element and toward the interior face of the information technology rack; and an engaging element that is adapted to move along the track and to engage with one or more of the plurality of information technology device modules stored by the information technology rack such that the engaging element inserts into the information technology rack and removes from the information technology rack one or more of the plurality of information technology device modules.

20. The data center heat containment system of claim 18, wherein a base of the vertical column of space defined by the interior faces of the plurality of information technology racks approximates a circle; and wherein the floor track system is included in the base.

* * * * *